(12) United States Patent
Jo et al.

(10) Patent No.: US 8,693,572 B2
(45) Date of Patent: Apr. 8, 2014

(54) METHOD FOR TRANSMITTING SIGNAL OF ORTHOGONAL FREQUENCY DIVISION MULTIPLEXING TYPE, AND APPARATUS APPLIED TO THE SAME

(75) Inventors: Gweon Do Jo, Daejeon (KR); Chang Wahn Yu, Daejeon (KR); Heon Kook Kwon, Daejeon (KR); Byung Su Kang, Daejeon (KR); Kwang Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/545,691

(22) Filed: Jul. 10, 2012

(65) Prior Publication Data

US 2013/0163690 A1  Jun. 27, 2013

(30) Foreign Application Priority Data

Dec. 26, 2011 (KR) ........................ 10-2011-0142208

(51) Int. Cl.
 *H04L 27/12* (2006.01)
(52) U.S. Cl.
 USPC ........... 375/295; 375/259; 375/260; 375/240; 375/240.18; 375/240.24

(58) Field of Classification Search
 USPC ........ 375/295, 259, 260, 240, 240.18, 240.24
 See application file for complete search history.

(56) References Cited

U.S. PATENT DOCUMENTS

| | | | |
|---|---|---|---|
| 5,839,100 A | 11/1998 | Wegener | |
| 7,110,387 B1* | 9/2006 | Kim et al. | ...................... 370/344 |
| 8,005,152 B2 | 8/2011 | Wegener | |
| 2004/0136464 A1* | 7/2004 | Suh et al. | ...................... 375/260 |
| 2007/0230598 A1* | 10/2007 | Wang | ............................. 375/260 |
| 2008/0205552 A1* | 8/2008 | Sartori et al. | .................. 375/316 |
| 2010/0232413 A1* | 9/2010 | Dakshinamurthy et al. | .. 370/343 |
| 2010/0305449 A1 | 12/2010 | Wegener et al. | |
| 2012/0176966 A1* | 7/2012 | Ling | ............................. 370/328 |

\* cited by examiner

*Primary Examiner* — Siu Lee
(74) *Attorney, Agent, or Firm* — Nelson Mullins Riley & Scarborough LLP; Anthony A. Laurentano, Esq.; Lewis Lee, Esq.

(57) ABSTRACT

The method for transmitting a signal of an orthogonal frequency division multiplexing type according to an exemplary embodiment of the present invention has a configuration allowing a radio unit (RU) to perform a component adding a compression component and a decompression component before/after a serial interface interlocking between a digital unit (DU) and the radio unit (RU) and a component inserting a cyclic prefix (CP) into a signal so as to secure orthogonality of an orthogonal frequency division multiplexing (OFDM) signal, in a structure in which a base station is physically divided into the DU and the RU.

13 Claims, 3 Drawing Sheets

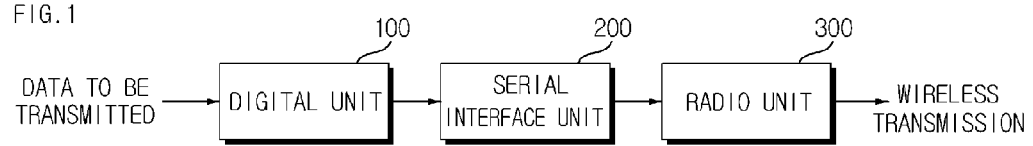
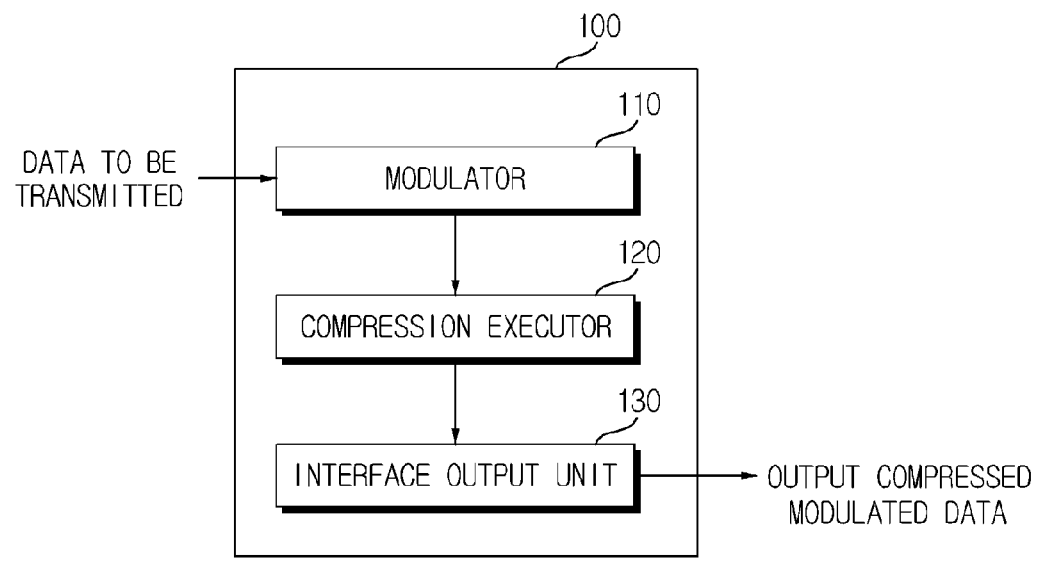

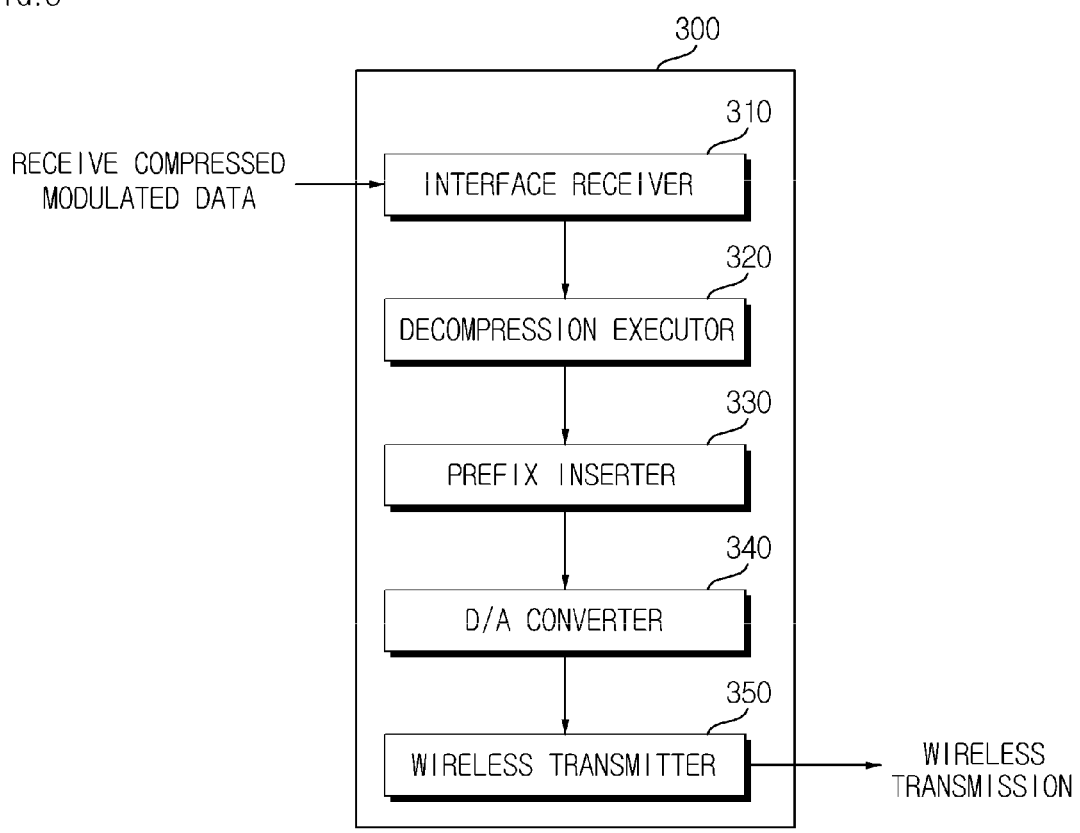

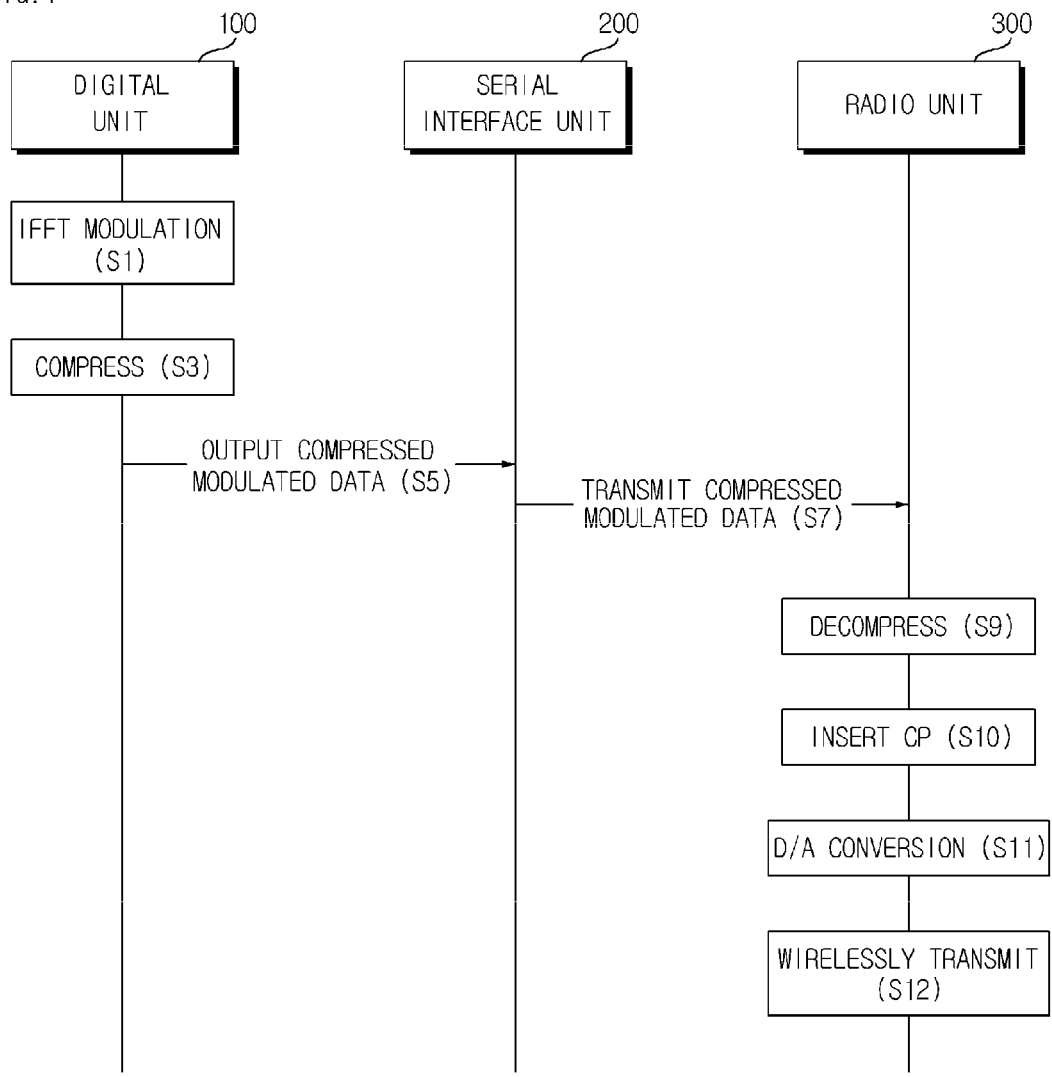

US 8,693,572 B2

METHOD FOR TRANSMITTING SIGNAL OF ORTHOGONAL FREQUENCY DIVISION MULTIPLEXING TYPE, AND APPARATUS APPLIED TO THE SAME

CROSS-REFERENCE TO RELATED APPLICATIONS

This application claims priority to and the benefit of Korean Patent Application No. 10-2011-0142208 filed in the Korean Intellectual Property Office on Dec. 26, 2011, the entire contents of which are incorporated herein by reference.

TECHNICAL FIELD

The present invention relates to a method for transmitting a signal of an orthogonal frequency division multiplexing (OFDM) type and an apparatus applied to the same, and more particularly, to a method for transmitting a signal of an orthogonal frequency division multiplexing (OFDM) type and an apparatus applied to the same for improving transmission efficiency of signals transmitted/received between a digital unit (DU) and a radio unit (RU), in a structure in which a base station is physically divided into the DU and the RU.

BACKGROUND ART

Generally, recent mobile communication systems have a tendency to divide a base station into a digital unit (DU) and a radio unit (RU) so as to reduce operating expenditure (OPEX) and capital expenditure (CAPEX). That is, the signal exchange between the DU and the RU has used a fast serial interface (for example, an optical interface such as CPRI or a SerDes technology such as rocket IO).

One base station transmits and receives several frequency bands and may often use multiple input multiple output (MIMO) so as to increase channel capacity.

According to the current tendency, there is a need to exchange different signals for each antenna or each frequency in exchanging a signal between the DU and the RU, which results in linearly increasing a signal data amount in response to the number of antennas and the number of frequencies.

However, the serial interface between the DU and the RU actually has a limited transmission rate. As a result, when intending to transmit and receive data at a highest transmission rate or more, a serial line needs to be additionally used and costs are correspondingly increased due to the use of the additional line.

Therefore, there is a need for a method for reducing a data amount transmitted and received from and to the serial interface between the DU and the RU.

SUMMARY OF THE INVENTION

The present invention has been made in an effort to provide a method for transmitting a signal of an orthogonal frequency division multiplexing type which allows a radio unit (RU) to perform a component adding a compression component and a decompression component before/after a serial interface interlocking between the DU and the RU and a component inserting a cyclic prefix (CP) into a signal so as to secure orthogonality of an orthogonal frequency division multiplexing (OFDM) signal, in a structure in which a base station is physically divided into the DU and the RU, and an apparatus applied to the same.

An exemplary embodiment of the present invention provides a method for transmitting a signal of an orthogonal frequency division multiplexing type, including: performing, by a digital unit, modulation to divide data to be transmitted into at least two data symbols and transmit the data in parallel over a plurality of subcarriers corresponding to the at least two data symbols; dividing and compressing the modulated data in a predetermined compression block unit and outputting the compressed modulated data; receiving the compressed modulated data by a radio unit interface-connected with the digital unit; decompressing the compressed modulated data and recovering the decompressed data into the modulated data and converting the recovered modulated data into a time domain signal; and wirelessly transmitting the time domain signal.

The method for transmitting a signal of an orthogonal frequency division multiplexing type may further include: after recovering the decompressed data to the modulated data in the converting of the recovered modulated data into a time domain signal, inserting a predetermined cyclic prefix into a guard section provided to prevent interference between the data symbols in a signal section in which the recovered modulated data are formed.

In the converting of the recovered modulated data into a time domain signal, modulation data in which the symbol interference is interrupted may be converted into the time domain signal.

In the wirelessly transmitting of the time domain signal, the modulated data in which the symbol interference is interrupted may be wirelessly transmitted.

In the modulating, the modulation may be executed by including inverse fast Fourier transform (IFFT).

In the inserting of the cyclic prefix, after copying a predetermined symbol region of a valid symbol section that is a section actually including the recovered modulated data in the signal section in which the recovered modulated data are formed, the copied symbol region may be inserted into the guard section.

In the inserting of the cyclic prefix, the last symbol section of the valid symbol section may be confirmed and copied as the symbol region.

Another exemplary embodiment of the present invention provides a method for transmitting a signal of an orthogonal frequency division multiplexing type, including: performing modulation to allow a digital unit to divide data to be transmitted into at least two data symbols and transmit the data in parallel over a plurality of subcarriers corresponding to the at least two data symbols; and dividing and compressing the modulated data in a predetermined compression block unit and outputting the compressed modulated data.

In the modulating, the modulation may be executed by including inverse fast Fourier transform (IFFT).

The outputting of the compressed modulated data may include: separating the modulated data into data corresponding to even subcarriers and data corresponding to odd subcarriers; compressing a compression block separated into the data corresponding to the even subcarriers and compressing a compression block separated into the data corresponding to the odd subcarriers; and outputting the compressed modulated data for each compression block.

The separating of the modulated data may be performed according to the following Equation.

$$f_{even}(n) = \{f(n)+f(n+N/2)\}/2, \text{however}, n=0,1,\ldots N/2-1$$

$$f_{odd}(n) = \{f(n)-f(n+N/2)\}/2, \text{however}, n=0,1,\ldots N/2-1 \quad \text{<Equation>}$$

(however, f(n): modulated data signal)

In the outputting of the modulated data, a bit transmission rate may be reduced to a predetermined level or less by the compression execution and then, the compressed modulated data may be output at the reduced bit transmission rate.

Another exemplary embodiment of the present invention provides a method for transmitting a signal of an orthogonal frequency division multiplexing type, including: receiving modulated data compressed by a radio unit interface-connected with a digital unit; decompressing the compressed modulated data and recovering the decompressed data to the modulated data and then, inserting a predetermined cyclic prefix into a guard section provided to prevent interference between the data symbols in a signal section in which the recovered modulated data are formed; and converting the modulated data in which symbol interference is interrupted into a time domain signal and wirelessly transmitting the time domain signal.

In the inserting of the cyclic prefix, the decompression may be performed according to the following Equation.

$$f(n)=f_{even}(n)+f_{odd}(n), \text{however}, n=0,1,\ldots N/2-1$$

$$f(n)=f_{even}(n-N/2)-f_{odd}(n-N/2), \text{however}, n=N/2, N/2+1, \ldots N-1 \qquad <\text{Equation}>$$

(However, f(n): modulated data signal)

In the inserting of the cyclic prefix, after copying a predetermined symbol region of a valid symbol section that is a section actually including the recovered modulated data in the signal section in which the recovered modulated data are formed, the copied symbol region may be inserted into the guard section.

Another exemplary embodiment of the present invention provides a system for transmitting a signal of an orthogonal frequency division multiplexing type, including: a digital unit configured to perform modulation to divide data to be transmitted into at least two data symbols and transmit the data in parallel over a plurality of subcarriers corresponding to the at least two data symbols, divide and compress the modulated data in a predetermined compression block unit, and output the compressed modulated data; a serial interface unit configured to receive the compressed modulated data from the digital unit and transmit the received data to a network; and a radio unit configured to receive the compressed modulated data, decompress the compressed modulated data and recover the decompressed data to the modulated data, convert the recovered modulated data into a time domain signal, and wirelessly transmit the time domain signal.

The radio unit may recover the decompressed data to the modulated data in the converting of the recovered modulated data into a time domain signal and then, insert a predetermined cyclic prefix into a guard section provided to prevent interference between the data symbols in a signal section in which the recovered modulated data are formed.

Another exemplary embodiment of the present invention provides a digital unit applied to signal transmission of an orthogonal frequency division multiplexing type, including: a modulator configured to divide data to be transmitted into at least two data symbols and transmit the data in parallel over a plurality of subcarriers corresponding to the at least two data symbols; a compression executor configured to divide and compress the modulated data in a predetermined compression block unit; and an interface output unit configured to output the compressed modulated data for interface transmission.

The modulator may execute the modulation by including inverse fast Fourier transform (IFFT).

The compression executor may include: a first compression executing module configured to separate the modulated data into data corresponding to even subcarriers and data corresponding to odd subcarriers; and a second compression executing module configured to compress a compression block separated into the data corresponding to the even subcarriers and compress a compression block separated into the data corresponding to the odd subcarriers.

The interface output unit may reduce a bit transmission rate to a predetermined level or less by the compression execution and then, output the compressed modulated data at the reduced bit transmission rate.

Another exemplary embodiment of the present invention provides a digital unit applied to signal transmission of an orthogonal frequency division multiplexing type, including: a prefix inserter configured to insert a predetermined cyclic prefix into a guard section provided to prevent interference between the data symbols in a signal section in which the recovered modulated data are formed; a D/A converter configured to convert the modulated data in which symbol interference is interrupted into the time domain signal; and a wireless transmitter configured to wirelessly transmit the time domain signal.

According to the exemplary embodiments of the present invention, it is possible to improve the transmission efficiency of signals transmitted and received between the DU and the RU by allowing the RU to perform the component adding the compression component and the decompression component before/after the serial interface interlocking between the DU and the RU and the component inserting the cyclic prefix (CP) into a signal so as to secure the orthogonality of the orthogonal frequency division multiplexing (OFDM) signal, in a structure in which the base station is physically divided into the DU and the RU.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 1 is a diagram showing a configuration of a system for transmitting a signal of an orthogonal frequency division multiplexing type according to an exemplary embodiment of the present invention.

FIG. 2 is a diagram showing an exemplary embodiment of a digital unit (DU) shown in FIG. 1.

FIG. 3 is a diagram showing an exemplary embodiment of a radio unit (RU) shown in FIG. 1.

FIG. 4 is a diagram showing an operation process of the system for transmitting a signal of an orthogonal frequency division multiplexing type according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, a system for transmitting a signal of an orthogonal frequency division multiplexing type according to an exemplary embodiment of the present invention will be described in more detail with reference to the accompanying drawings.

Disclosed are a method for transmitting a signal of an orthogonal frequency division multiplexing type and an apparatus applied to the same. The method for transmitting a signal of an orthogonal frequency division multiplexing type according to an exemplary embodiment of the present invention has a configuration allowing a radio unit (RU) to perform a component adding a compression component and a decompression component before/after a serial interface interlocking between a digital unit (DU) and the radio unit (RU) and a component inserting a cyclic prefix (CP) into a signal so as to secure orthogonality of an orthogonal frequency division multiplexing (OFDM) signal, in a structure in which a base station is physically divided into the DU and the RU. Therefore, the exemplary embodiment of the present invention can improve transmission efficiency of signals transmitted and received between the DU and the RU.

FIG. 1 is a diagram showing a configuration of a system for transmitting a signal of an orthogonal frequency division multiplexing (OFDM) type according to an exemplary embodiment of the present invention. As shown in FIG. 1 by way of example only, the system for transmitting a signal of an orthogonal frequency division multiplexing (OFDM) type is to improve efficiency of signals transmitted and received from and to a serial interface unit 200 interlocking a digital unit (DU) 100 and a radio unit (RU) 300, in a structure in which a base station is physically divided into the DU 100 and the RU 300.

To this end, the system for transmitting a signal of an OFDM type includes components for two schemes and is configured to allow the RU 300 to perform (1) a component adding a compression component and a decompression component before/after a serial interface unit 200 and (2) a component inserting a cyclic prefix (CP) into a signal so as to secure orthogonality of an orthogonal frequency division multiplexing (OFDM) signal.

That is, the system for transmitting a signal of an OFDM type is configured to include a digital unit that divides data to be transmitted into at least two symbols, perform modulation for executing parallel transmission of data over a plurality of subcarriers corresponding to the at least data symbols, divides and compresses the modulated data in a predetermined compression block unit, and outputs the compressed modulated data; a serial interface unit 200 that receives the compressed modulated data from the digital unit and transmits the received data to a network, and a radio unit that receives the compressed modulated data, decompresses the compressed modulated data and recovers the decompressed data into the modulated data, and converts the recovered modulated data into a time domain signal and wirelessly transmits the time domain signal.

In this configuration, the DU modulates the data to be transmitted and transmits the modulated data in parallel over a plurality of subcarriers. The modulation type may be performed by inverse fast Fourier transform (IFFT).

For example, when the data to be transmitted is '1011', the OFDM type divides the '1011' into 1, 0, 1, 1, respectively, and modulates '1 into frequency f1, 0 into frequency f2, 1 into frequency f3, and 1 into frequency f4' and then, transmits the modulated data in parallel.

That is, when simultaneously intending to transmit four data in parallel through four different frequencies, there is a need to construct hardware architecture capable of transmit each subcarrier through four transmitters. However, it is possible to transmit data over a single carrier by inverse fast Fourier transform (IFFT).

FIG. 2 is a diagram showing the digital unit (DU) shown in FIG. 1. As shown in FIG. 2 by way of example only, the DU 100 includes a modulator 110 that divides the data to be transmitted into at least two data symbols and transmits the data in parallel over a plurality of subcarriers corresponding to the at least two data symbols, a compression executor 120 that divides and compresses the modulated data in a predetermined compression block, and an interface output unit 130 that outputs the compressed modulated data for interface transmission.

In this configuration, as described above, the modulator 110 may perform the modulation by the IFFT type.

The compression executor 120 may include a first compression executing module that separates the modulated data into data corresponding to even subcarriers and data corresponding to odd subcarriers and a second compression executing module that compresses a compression block separated into the data corresponding to the even subcarriers and a compression block separated into the data corresponding to the odd subcarriers.

The first compression executing module separates the data modulated according to the following Equation into the data corresponding to the even subcarriers and the data corresponding to the odd subcarriers.

$$f_{even}(n) = \{f(n) + f(n+N/2)\}/2, \text{however}, n = 0, 1, \ldots N/2-1$$

$$f_{odd}(n) = \{f(n) - f(n+N/2)\}/2, \text{however}, n = 0, 1, \ldots N/2-1 \quad \text{<Equation>}$$

(However, f(n): modulated data signal)

Through the above Equation, $f_{even}(n)$ is a sum of signals corresponding to even-numbered subcarriers and $f_{odd}(n)$ is a sum of signals corresponding to odd-numbered subcarriers.

That is, $f_{even}(n)$ or $f_{odd}(n)$ is a signal length corresponding to a half of all the signal symbols according to the predefined Equations.

Accordingly, as the signal transmitted to the serial interface unit 200 between the DU 100 and the RU 300 is $f_{even}(n)$ or $f_{odd}(n)$, a signal magnitude transmitted to the serial interface unit 200 is reduced to a predetermined level or less.

For example, when 10 bits are allocated to f(n) that is the modulated data signal, $f_{even}(n)$ or $f_{odd}(n)$ is a signal magnitude that is a half of f(n), and thus even though 9 bits that is smaller by 1 bit than 10 bits are allocated to f(n), it is possible to sufficiently perform a signal transmission.

That is, the interface output unit 130 may reduce a bit transmission rate to a predetermined level or less through the compression execution and then output the modulated data compressed at the reduced bit transmission rate.

FIG. 3 is a diagram showing the radio unit (RU) 300 shown in FIG. 1. As shown in FIG. 3 by way of example only, the radio unit 300 is configured to include an interface receiver 310 that receives the compressed modulated data transmitted through an interface relay, a decompression executor 320 that decompresses the compressed modulated data and recovers the decompressed data into the modulated data, a prefix inserter 330 that inserts a predetermined cyclic prefix into a guard section provided to prevent interference between data symbols in a signal section in which the recovered modulated data are formed, a D/A converter 340 that converts the modulated data in which the symbol interference is interrupted into the time domain signal, and a wireless transmitter 350 that wireless transmit the time domain signal.

In this configuration, the prefix inserter 330 copies a predetermined symbol region of a valid symbol section that is a section actually including the recovered modulated data in the signal section in which the recovered modulated data are formed. and then, inserts the copied symbol region into the guard section. That is, the symbol transmission in the OFDM type is performed in a symbol unit but is affected by a previous symbol during the transmission of the OFDM symbol over a multi-path channel. In order to prevent the interference between the OFDM symbols, the guard section longer than maximum delay diffusion of the channel is inserted between consecutive symbols.

The OFDM symbol period is a sum of the valid symbol section in which the actual data are transmitted and the guard section. Therefore, at the data receiving side, the guard section is removed and then the data within the valid symbol section are acquired and demodulated.

Therefore, the prefix inserter 330 may copy a signal of the last section in the valid symbol section so as to prevent a breakage of orthogonality that may occur due to the delay of the subcarriers and set the copied signal as the cyclic prefix (CP).

The decompression executor 320 performs the decompression according to the following Equation.

$$f(n)=f_{even}(n)+f_{odd}(n), \text{however}, n=0,1,\ldots N/2-1$$

$$f(n)=f_{even}(n-N/2)-f_{odd}(n-N/2), \text{however}, n=N/2, N/2+1,\ldots N-1 \qquad \text{<Equation>}$$

(however, f(n): modulated data signal)

That is, as the radio unit 300 performs the cyclic prefix (CP), the data amount transmitted and received between the DU 100 and the RU 300 may be reduced to a predetermined level or less.

FIG. 4 is a diagram showing an operation process of the system for transmitting a signal of an orthogonal frequency division multiplexing type according to an exemplary embodiment of the present invention. As shown in FIG. 4 by way of example only, the method for transmitting a signal of an OFDM type allows the DU 100 to divide the data to be transmitted into at least two data symbols and perform the IFFT that is modulation to transmit the data in parallel over a plurality of subcarriers corresponding to the at least two data symbols (S1).

Next, the DU 100 divides the data modulated in step S1 in the predetermined compression block unit and then compresses each divided compression block (S3). In step S3, each compressed modulated data are transmitted to the RU 300 via the serial interface unit 200 (S5 to S7).

Thereafter, the RU 300 decompresses the compressed modulated data and recovers the decompressed data into the modulated data and then inserts the predetermined cyclic prefix into the guard period provided to prevent the interference between the data symbols in the signal section in which the recovered modulated data are formed (S9 and S11).

The RU 300 converts the modulated data in which the symbol interference is interrupted into the time domain signal, and wirelessly transmit the time domain signal (S11 and S12).

The present invention can improve the transmission efficiency of signals transmitted and received between the DU and the RU in the structure in which the base station is physically divided into the DU and the RU, and as a result, can have high marketability and business and be clearly worked. Therefore, the present invention has industrial applicability.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A method for transmitting a signal of an orthogonal frequency division multiplexing type, comprising:
    performing modulation to allow a digital unit to divide data to be transmitted into at least two data symbols and transmit the data in parallel over a plurality of subcarriers corresponding to the at least two data symbols;
    dividing and compressing the modulated data in a predetermined compression block unit and outputting the compressed modulated data;
    receiving the compressed modulated data by a radio unit interface-connected with the digital unit;
    decompressing the compressed modulated data and recovering the decompressed data into the modulated data and converting the recovered modulated data into a time domain signal; and
    wirelessly transmitting the time domain signal,
    wherein the outputting of the compressed modulated data includes,
    separating the modulated data into data corresponding to even subcarriers and data corresponding to odd subcarriers;
    compressing a compression block separated into the data corresponding to the even subcarriers and compressing a compression block separated into the data corresponding to the odd subcarriers; and
    outputting the compressed modulated data for each compression block.

2. The method of claim 1, further comprising: after recovering the decompressed data to the modulated data in the converting of the recovered modulated data into the time domain signal, inserting a predetermined cyclic prefix into a guard section provided to prevent interference between the data symbols in a signal section in which the recovered modulated data are formed.

3. The method of claim 2, wherein in the converting of the recovered modulated data into the time domain signal, modulation data in which the symbol interference is interrupted are converted into the time domain signal.

4. The method of claim 3, wherein in the wirelessly transmitting of the time domain signal, the modulated data in which the symbol interference is interrupted is wirelessly transmitted.

5. The method of claim 1, wherein the modulation is executed by inverse fast Fourier transform (IFFT).

6. The method of claim 2, wherein in the inserting of the cyclic prefix, after copying a predetermined symbol region of a valid symbol section that is a section actually including the recovered modulated data in the signal section in which the recovered modulated data are formed, the copied symbol region is inserted into the guard section.

7. The method of claim 6, wherein in the inserting of the cyclic prefix, the last symbol section of the valid symbol section is confirmed and copied as the guard region.

8. A method for transmitting a signal of an orthogonal frequency division multiplexing type, comprising: performing modulation to allow a digital unit to divide data to be transmitted into at least two data symbols and transmit the data in parallel over a plurality of subcarriers corresponding to the at least two data symbols; and dividing and compressing the modulated data in a predetermined compression block unit and outputting the compressed modulated data,
wherein the outputting of the compressed modulated data includes,
separating the modulated data into data corresponding to even subcarriers and data corresponding to odd subcarriers;
compressing a compression block separated into the data corresponding to the even subcarriers and compressing a compression block separated into the data corresponding to the odd subcarriers; and
outputting the compressed modulated data for each compression block.

9. The method of claim 8, wherein the modulation is executed by inverse fast Fourier transform (IFFT).

10. The method of claim 8, wherein the separating of the modulated data is performed according to the following Equation:

$$f_{even}(n)=\{f(n)+f(n+N/2)\}/2, \text{however}, n=0,1,\ldots N/2-1$$

$$f_{odd}(n)=\{f(n)-f(n+N/2)\}/2, \text{however}, n=0,1,\ldots N/2-1, \text{wherein } f(n): \text{modulated data signal}.$$

11. The method of claim 8, wherein in the outputting of the compressed modulated data, a bit transmission rate is reduced to a predetermined level or less by the compression and then the compressed modulated data are output at the reduced bit transmission rate.

12. A method for transmitting a signal of an orthogonal frequency division multiplexing type, comprising:
receiving modulated data compressed by a radio unit interface-connected with a digital unit;
decompressing the compressed modulated data and recovering the decompressed data to the modulated data and then, inserting a predetermined cyclic prefix into a guard section provided to prevent interference between data symbols in a signal section in which the recovered modulated data are formed; and
converting the modulated data in which symbol interference is interrupted into a time domain signal and wirelessly transmitting the time domain signal,
wherein in the inserting of the cyclic prefix, the decompression is performed according to the following Equation:

$$f(n)=f_{even}(n)+f_{odd}(n), \text{however}, n=0,1,\ldots N/2-1$$

$$f(n)=f_{even}(n-N/2)-f_{odd}(n-N/2), \text{however}, n=N/2, N/2+1,\ldots N-1, \text{wherein } f(n): \text{modulated data signal}.$$

13. The method of claim 12, wherein in the inserting of the cyclic prefix, after copying a predetermined symbol region of a valid symbol section that is a section actually including the recovered modulated data in the signal section in which the recovered modulated data are formed, the copied symbol region is inserted into the guard section.

* * * * *